United States Patent
Yoo et al.

(10) Patent No.: US 8,198,198 B2
(45) Date of Patent: Jun. 12, 2012

(54) METHOD FOR FORMING ELECTRODE PATTERN OF CERAMIC SUBSTRATE

(75) Inventors: Won Hee Yoo, Suwon-si (KR); Byeung Gyu Chang, Suwon-si (KR); Yong Suk Kim, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 384 days.

(21) Appl. No.: 12/458,834

(22) Filed: Jul. 23, 2009

(65) Prior Publication Data

US 2010/0301009 A1 Dec. 2, 2010

(30) Foreign Application Priority Data

Jun. 2, 2009 (KR) .................. 10-2009-0048593

(51) Int. Cl.
*H01L 21/302* (2006.01)
(52) U.S. Cl. ......... 438/754; 438/745; 438/756; 216/100
(58) Field of Classification Search .................. 438/674, 438/745, 754, 756, 763; 216/83, 95, 100
See application file for complete search history.

(56) References Cited

U.S. PATENT DOCUMENTS

| 7,943,510 B2 * | 5/2011 | Takahashi et al. ............ 438/660 |
| 2004/0262645 A1 * | 12/2004 | Huff et al. .................... 257/232 |
| 2009/0107851 A1 * | 4/2009 | Kodera et al. ................. 205/656 |

FOREIGN PATENT DOCUMENTS

KR 10-0771783 10/2007

* cited by examiner

*Primary Examiner* — Lan Vinh

(57) ABSTRACT

The present invention relates to a method for forming electrode patterns of a ceramic substrate including the steps of: forming a plurality of conductive adhesion patterns on the ceramic substrate to be separated apart from one another; forming a plating seed layer, covering the conductive adhesion patterns, on the ceramic substrate; forming photoresist patterns, exposing parts corresponding to the conductive adhesion patterns, on the plating seed layer; forming a plating layer on the plating seed layer exposed by the photoresist patterns; removing the photoresist patterns; and etching parts of the plating seed layer exposed by removal of the photoresist patterns.

8 Claims, 3 Drawing Sheets

[FIG. 1]
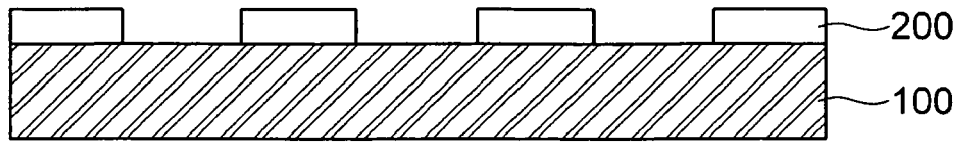
[FIG. 2]
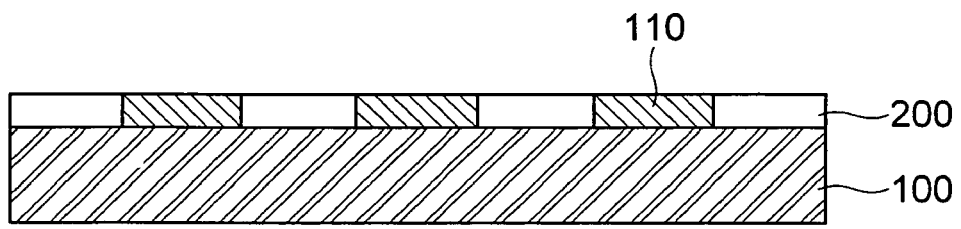
[FIG. 3]
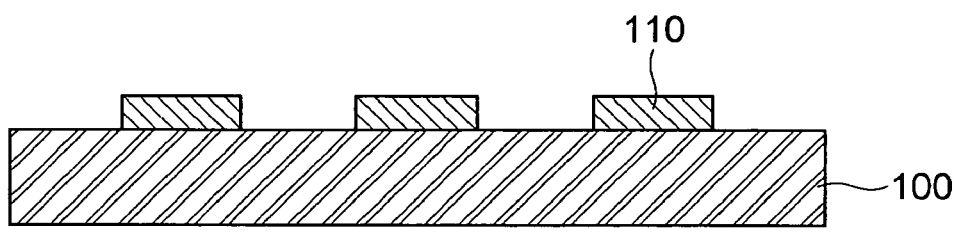
[FIG. 4]
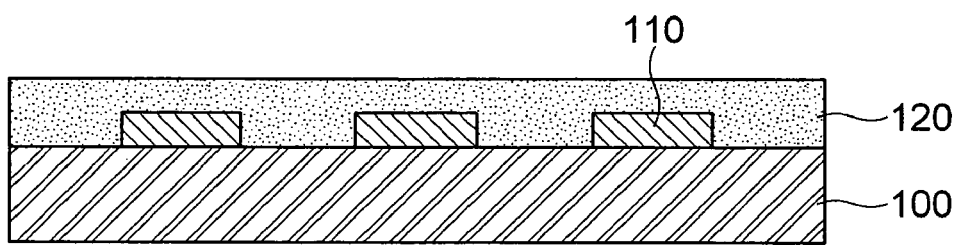
[FIG. 5]
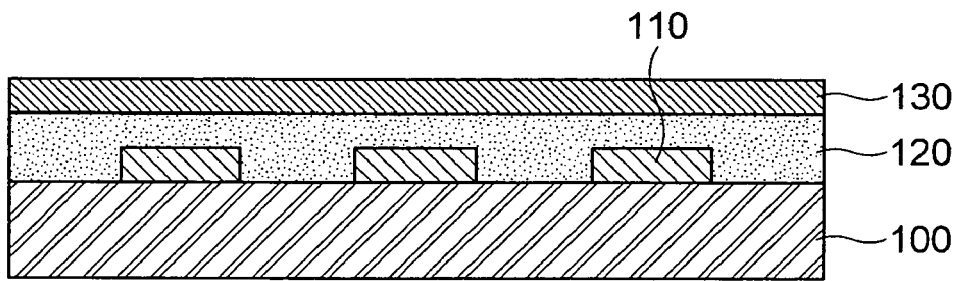

[FIG. 6]
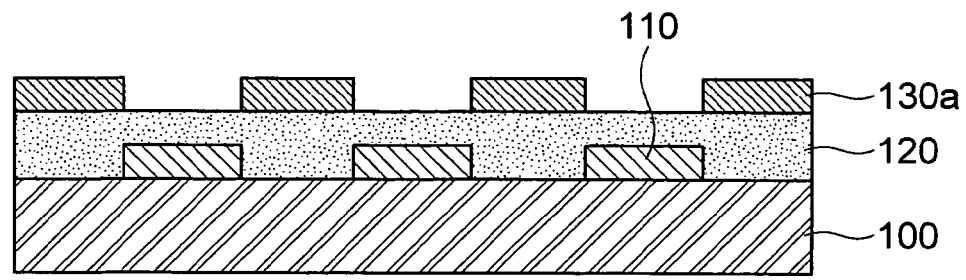
[FIG. 7]
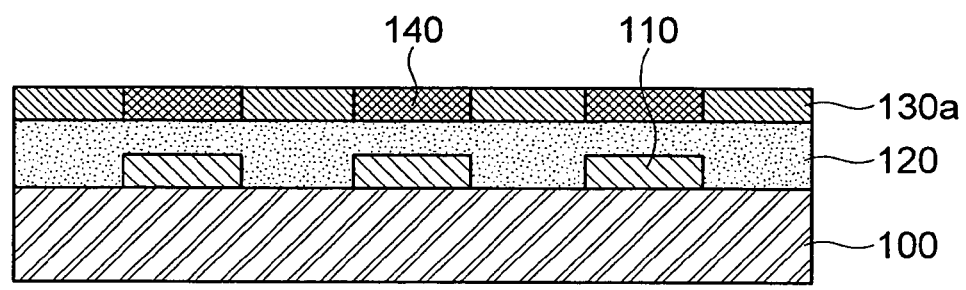
[FIG. 8]
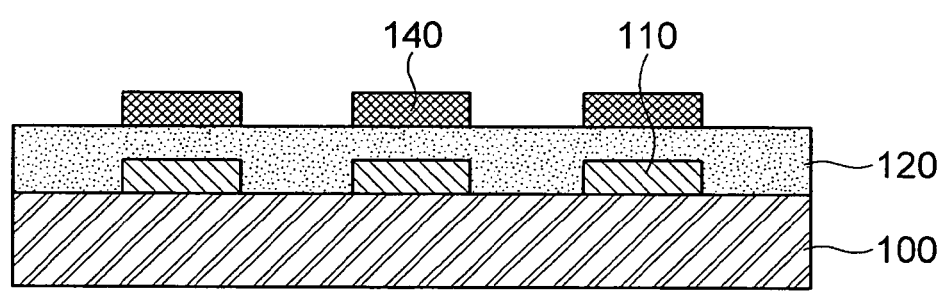
[FIG. 9]
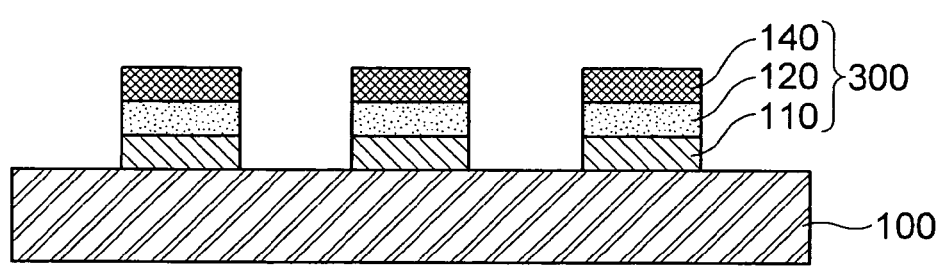

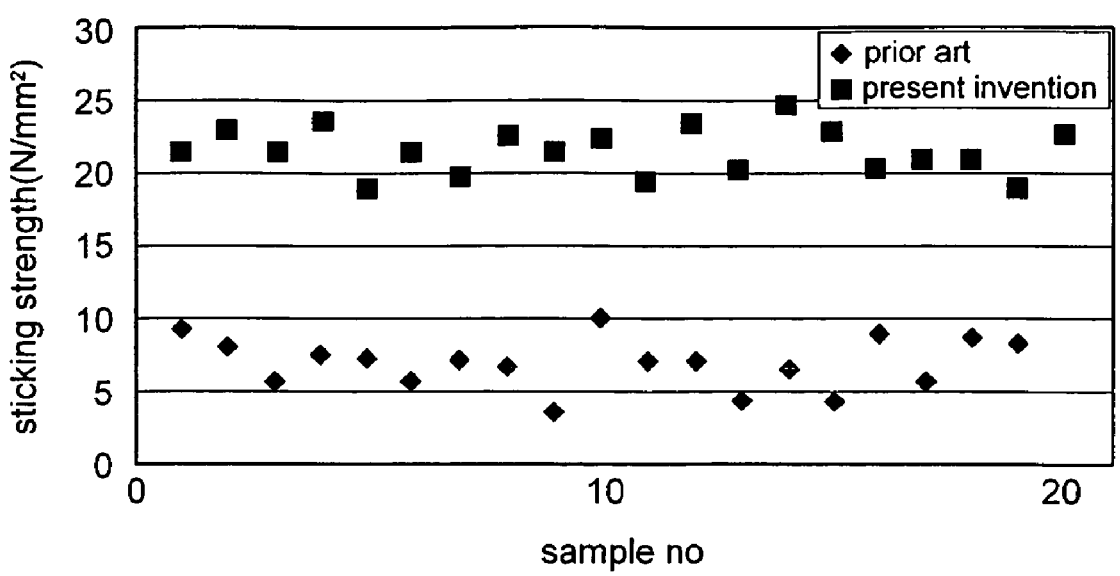

METHOD FOR FORMING ELECTRODE PATTERN OF CERAMIC SUBSTRATE

CROSS-REFERENCE TO RELATED APPLICATIONS

This application claims the benefit of Korean Patent Application No. 10-2009-0048593 filed with the Korea Intellectual Property Office on Jun. 2, 2009, the disclosure of which is incorporated herein by reference.

BACKGROUND OF THE INVENTION

1. Field of the Invention

The present invention relates to a method for forming electrode patterns of a ceramic substrate; and, more particularly, to a method for forming electrode patterns of a ceramic substrate, in which conductive adhesion patterns are formed on an LTCC substrate through a mask, without having to perform an etching process, thereby improving sticking strength of the electrode patterns due to omission of the etching process.

2. Description of the Related Art

There has been increased a demand for a ceramic substrate formed by applying a thin-film electrode pattern instead of an existing electrode print scheme to a surface layer of an integrated multilayer substrate for a probe card which tests a high frequency module of a mobile communication, a microwave connector, a cable assembly, a semiconductor chip, and so on. In case where the thin-film electrode pattern is applied to the surface layer of the ceramic substrate, the ceramic substrate can be implemented to have a fine pattern, compared to the printed electrode pattern. Further, it is possible to increase plating thickness.

As for a ceramic substrate, an HTCC (High Temperature Co-fired Ceramic) substrate or an LTCC (Low Temperature Co-fired Ceramic) substrate is widely used. Herein, the HTCC substrate is heat-treated at a temperature of 1500° C. or higher to thereby form a multilayer substrate. As for material of the HTCC substrate, alumina of 94% or more is used as main material, and a small amount of SiO2 is used as an additive. As for material of an electrode pattern, tungsten W capable of high-temperature firing is mostly used.

Since such an HTCC substrate is superior in terms of mechanical strength and chemical resistance characteristics, the HTCC substrate is provided with the thin-film electrode pattern on the surface thereof, so as to be widely used as an integrated package. However, an electrode pattern made of high-temperature fired tungsten W has electrical conductance lower than that of Ag, or Cu, and thus it has inferior high frequency characteristics and has coefficient of thermal expansion higher than two times that of a silicon semiconductor device, which causes an obstacle to the application field requiring matching of coefficient of thermal expansion.

Contrary to this, an LTCC substrate is heat-treated at a temperature of 900° C. or lower to thereby form a multilayer substrate. In order to use the LTCC substrate at a temperature of 900° C. or lower, a large amount of SiO2 having a low melting point is used, and alumina is relatively less used. As the firing temperature becomes 900° C. or lower, Ag, or Cu may be used as material of an electrode pattern. Resistors, inductors and condensers of being passive components are incorporated into the substrate, so that the substrate can be widely used for miniaturization, convergence, and modularization, and high-frequency of electric components However, since the LTCC substrate contains a large amount of SiO2, a surface layer of the substrate containing SiO2 is easily etched in an etching process using strong acid chemicals like HF, or strong base chemicals like KOH, which causes degradation in sticking strength of a thin-film electrode pattern formed on the surface layer of an LTCC substrate.

That is, in the prior art, in order to improve adhesion between the LTCC substrate and the electrode pattern, a conductive adhesion layer, for example, Ti layer, is formed on a front surface of the LTCC substrate, and then the Ti layer is etched to be as large as the electrode pattern. However, since an etchant used at the time of etching the Ti layer corresponds to strong acid chemicals like HF, or strong base chemicals like KOH, the surface layer of the LTCC substrate containing a large amount of SiO2 is easily etched by the etchant. In addition, an undercut is produced between the Ti layer and the surface layer of the LTCC substrate, and between the Ti layer and a plating layer formed thereon, which causes difficulty in forming a thin-film electrode pattern. Even if a thin-film electrode pattern is formed, sticking strength is reduced.

SUMMARY OF THE INVENTION

The present invention has been invented in order to overcome the above-described problems and it is, therefore, an object of the present invention to provide a method for forming electrode patterns of a ceramic substrate, in which conductive adhesion patterns are formed on an LTCC substrate through a mask, without having to perform an etching process, thereby improving sticking strength of the electrode patterns due to omission of the etching process.

In accordance with one aspect of the present invention to achieve the object, there is provided a method for forming electrode patterns of a ceramic substrate including the steps of: forming a plurality of conductive adhesion patterns on the ceramic substrate to be separated apart from one another; forming a plating seed layer, covering the conductive adhesion patterns, on the ceramic substrate; forming photoresist patterns, exposing parts corresponding to the conductive adhesion patterns, on the plating seed layer; forming a plating layer on the plating seed layer exposed by the photoresist patterns; removing the photoresist patterns; and etching parts of the plating seed layer exposed by removal of the photoresist patterns.

Herein, the ceramic substrate corresponds to an LTCC substrate.

The step of forming a plurality of conductive adhesion patterns on the ceramic substrate to be separated apart from one another includes the steps of: forming a mask on the ceramic substrate, the mask being punched in an area corresponding to regions where the conductive adhesion patterns are to be formed; depositing the conductive adhesion patterns on the ceramic substrate opened by the mask; and removing the mask.

Herein, the mask is made of any one of metallic, glass, acryl, and photoresist materials.

Herein, the conductive adhesion patterns are deposited by Ti.

Herein, the plating seed layer is formed of Cu.

Herein, the plating layer includes at least one of Cu, Ni, and Au.

In step of etching parts of the plating seed layer exposed by removal of the photoresist patterns, the plating seed layer is etched by using an etchant having pH of 6 to 7.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 1 to 9 are cross-sectional views sequentially showing processes for explaining a method for forming electrode patterns of the ceramic substrate in accordance with the embodiment of the present invention; and FIG. 10 is a graph showing a comparison between sticking strength of an electrode pattern of the present invention and sticking strength of an electrode pattern in the prior art.

DETAILED DESCRIPTION OF THE PREFERABLE EMBODIMENTS

Hereinafter, a method for forming electrode patterns of a ceramic substrate in accordance with a preferred embodiment of the present invention will be described in more detail with reference to accompanying drawings.

A detailed description will be given of a method for forming electrode patterns of a ceramic substrate in accordance with an embodiment of the present invention, with reference to FIGS. 1 to 9.

FIGS. 1 to 9 are cross-sectional views sequentially showing a process for explaining a method for forming electrode patterns of the ceramic substrate in accordance with the embodiment of the present invention.

As shown in FIG. 1, the method for forming the electrode patterns of the ceramic substrate in accordance with an embodiment of the present invention is achieved by preparing a ceramic substrate 100, and then forming masks 200 punched in an area corresponding to regions at which conductive adhesion patterns (indicated by reference numeral "110" of FIG. 2) are to be formed on the ceramic substrate 100.

Herein, the ceramic substrate 100 may be an LTCC substrate formed by being subjected to a firing process at a low temperature of being 900° C. or lower, which is not shown in the drawing. However, the ceramic substrate 100 may include multilayer ceramic layers, wiring layers interposed between the multilayer ceramic layers, and vias which allow the wiring layers to be electrically connected to one another through the ceramic layers.

A mask of metallic material may be used as the masks 200. The mask of metallic material may be replaced with a mask of transparent material, for example, a mask of glass material, a mask of acryl material, or the like.

Furthermore, the masks 200 may be made of a photo resist material which has superior contact force with respect to a surface of the ceramic substrate 100, in addition to metallic material, glass material, and acryl material as described above.

Thereafter, as shown in FIG. 2, the conductive adhesion patterns 110 are deposited on the ceramic substrate 100 opened by the masks 200. The conductive adhesion patterns 110 may be made of a conductive material which has superior adhesion with respect to the ceramic substrate 100, for example, Ti, or the like.

Thereafter, as shown in FIG. 3, the masks 200 are removed from the ceramic substrate 100. After removal of the masks 200, a plurality of conductive adhesion patterns may be formed to be separated apart from one another on the ceramic substrate 100.

Thereafter, as shown in FIG. 4, a plating seed layer 120 which covers the conductive adhesion patterns 110 is formed on the ceramic substrate 100. The plating seed layer 120 plays a role of a seed for formation of plating layers (indicated by reference numeral "140" of FIG. 7) which is to be described. The plating seed layer 120 may be made of Cu, or the like.

Thereafter, as shown in FIG. 5, a photoresist 130 is applied on the plating seed layer 120. Then, as shown in FIG. 6, the photoresist 130 is subjected to an exposing process and a developing process to thereby form the photoresist patterns 130a which expose parts corresponding to the conductive adhesion patterns 110.

Thereafter, as shown in FIG. 7, plating layers 140 are formed on the plating seed layer 120 exposed by the photoresist patterns 130a. The plating layers 140 may be formed to be either a single layer made of any one of Cu, Ni, and Au, or a multiple layer formed by being sequentially stacked with Cu, Ni, and Au.

Thereafter, as shown in FIG. 8, the photoresist patterns 130a are removed.

Then, as shown in FIG. 9, parts of the plating seed layer 120 exposed by removal of the photoresist patterns 130a are subjected to an etching process, thereby forming electrode patterns 300 stacked with the conductive adhesion patterns 110, the plating seed layers 120, and the plating layers 140 in order.

Herein, the etching process used in the plating seed layer 120 may be a wet etching.

Further, since the plating seed layer 120 may be made of Cu, Cu etchant whose ph is 6 to 7 may be used in the wet etching process of the plating seed layer 120.

In this case, unlike strong base chemicals like KOH, or strong acid chemicals like HF used as an etchant at the time of etching an existing Ti layer, an etchant having pH of the above-mentioned values fails to etch the surface layer of the ceramic substrate 100 formed of an LTCC substrate containing a large amount of SiO2, and fails to generate a undercut between the conductive adhesion pattern 110 and the plating layers 140 and between the ceramic substrate 100 and the conductive adhesion patterns 110.

Therefore, according to the method for forming electrode patterns of the ceramic substrate in accordance with the embodiment of the present invention, no undercut is generated, and sticking strength of the electrode patterns is increased.

Hereinafter, a description will be given of an effect of the method for forming the electrode patterns of the ceramic substrate in accordance with the embodiment of the present invention, with reference to FIG. 10.

FIG. 10 is a graph showing comparison of sticking strength between an electrode pattern of the present invention and an electrode pattern of the prior art.

As shown in FIG. 10, comparison of sticking strength between an electrode pattern of the present invention and an electrode pattern of the prior art shows that the sticking strength of the electrode pattern according to the present invention is three times as large as that of the electrode pattern according to the prior art. Herein, the sticking strength of the electrode pattern in the prior art is, on average, 7 N/mm$^2$, whereas the electrode pattern formed without an etching process of Ti in accordance with the present invention is, on average, 21 N/mm$^2$.

According to the method for forming electrode patterns of the ceramic substrate in accordance with the embodiment of the present invention, it is possible to form electrode patterns on the ceramic substrate 100 formed of the LTCC substrate through a mask without having to perform an etching process using an etchant of strong acid chemicals or strong base chemicals which was required to be used for formation of the conductive adhesion patterns 110 in the prior art. In this case, the conductive adhesion patterns 110 of Ti material positioned on the lowermost layer of the electrode patterns 300 is in a pattern shape.

Therefore, in accordance with the embodiment of the present invention, it is possible to prevent the surface layer of the ceramic substrate 100 and the electrode patterns 300 from being damaged due to an etchant of the strong acid chemicals or the strong base chemicals, thereby improving the sticking strength of the electrode patterns 300 formed on the surface layer of the ceramic substrate 100, and ensuring durability and reliability of the electrode patterns 300.

As described above, by the method for forming an electrode pattern of a ceramic substrate in accordance with an embodiment of the present invention, in forming electrode patterns on the LTCC substrate, conductive adhesion patterns of Ti material positioned on the lowermost layer of the electrode patterns are formed to be in a pattern shape by using a mask, thereby omitting an etching process which was required to be done for formation of the conductive adhesion patterns in the prior art.

Therefore, since the present invention is unnecessary to use an etchant of strong acid chemicals or strong base chemicals that were used in an etching process for formation of the conductive adhesion patterns, it is possible to prevent the surface layer of the LTCC substrate from being etched by the etchant of strong acid or strong base chemicals. Further, it is possible to prevent a undercut between the surface layer of the LTCC substrate and the conductive adhesion patterns, and between the conductive adhesion patterns and the plating layer. Accordingly, the present invention can improve sticking strength of the electrode patterns formed on the LTCC substrate, and thus ensure durability and reliability of the electrode patterns.

As described above, although the preferable embodiments of the present invention have been shown and described, it will be appreciated by those skilled in the art that substitutions, modifications and changes may be made in this embodiment without departing from the principles and spirit of the general inventive concept, the scope of which is defined in the appended claims and their equivalents.

What is claimed is:

1. A method for forming electrode patterns of a ceramic substrate comprising:
    forming a plurality of conductive adhesion patterns on the ceramic substrate to be separated apart from one another;
    forming a plating seed layer, covering the conductive adhesion patterns, on the ceramic substrate;
    forming photoresist patterns, exposing parts corresponding to the conductive adhesion patterns, on the plating seed layer;
    forming a plating layer on the plating seed layer exposed by the photoresist patterns;
    removing the photoresist patterns; and
    etching parts of the plating seed layer exposed by removal of the photoresist patterns.

2. The method of claim 1, wherein the ceramic substrate corresponds to an LTCC substrate.

3. The method of claim 1, wherein the forming a plurality of conductive adhesion patterns on the ceramic substrate comprises:
    forming a mask on the ceramic substrate, the mask being punched in an area corresponding to regions where the conductive adhesion patterns are to be formed;
    depositing the conductive adhesion patterns on the ceramic substrate opened by the mask; and
    removing the mask.

4. The method of claim 3, wherein the mask is made of any one of metallic, glass, acryl, and photoresist materials.

5. The method of claim 3, wherein the conductive adhesion patterns are deposited with Ti.

6. The method of claim 1, wherein the plating seed layer is formed of Cu.

7. The method of claim 1, wherein the plating layer includes at least one of Cu, Ni, and Au.

8. The method of claim 1, wherein, in the etching parts of the plating seed layer, the plating seed layer is etched by using an etchant having pH of about 6 to about 7.

\* \* \* \* \*